(12) United States Patent
Kai et al.

(10) Patent No.: US 6,996,142 B2
(45) Date of Patent: Feb. 7, 2006

(54) LIGHT SOURCE DEVICE AND WAVELENGTH CONTROL DEVICE THEREFOR

(75) Inventors: Yutaka Kai, Kawasaki (JP); Hideyuki Miyata, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 106 days.

(21) Appl. No.: 09/804,250

(22) Filed: Mar. 13, 2001

(65) Prior Publication Data

US 2002/0070359 A1 Jun. 13, 2002

(30) Foreign Application Priority Data

Oct. 30, 2000 (JP) ............... 2000-330298

(51) Int. Cl.
*H01S 3/04* (2006.01)
*H01S 3/14* (2006.01)

(52) U.S. Cl. ............... 372/34; 372/36; 372/68
(58) Field of Classification Search ......... 372/34, 372/102, 32
See application file for complete search history.

(56) References Cited

U.S. PATENT DOCUMENTS

| | | | | |
|---|---|---|---|---|
| 5,438,579 A | * | 8/1995 | Eda et al. ............... 372/32 |
| 5,859,945 A | * | 1/1999 | Kato et al. ............... 385/33 |
| 5,966,394 A | * | 10/1999 | Spurr et al. ............ 372/29.015 |
| 5,974,064 A | * | 10/1999 | Uchida ............... 372/38.02 |
| 6,282,340 B1 | * | 8/2001 | Nasu et al. ............... 372/20 |
| 6,389,046 B1 | * | 5/2002 | Stayt et al. ............. 372/38.02 |
| 6,449,077 B1 | * | 9/2002 | Broutin et al. ............... 372/32 |
| 6,501,773 B1 | * | 12/2002 | Volz et al. ............... 372/29.02 |
| 6,516,010 B1 | * | 2/2003 | Broutin et al. .......... 372/29.01 |
| 6,560,255 B1 | * | 5/2003 | O'Brien et al. ............... 372/34 |

FOREIGN PATENT DOCUMENTS

JP 03091982 A 4/1991
JP 10326939 A 12/1998

* cited by examiner

Primary Examiner—Minsun Oh Harvey
Assistant Examiner—Armando Rodriguez
(74) Attorney, Agent, or Firm—Staas & Halsey LLP

(57) ABSTRACT

Disclosed herein is a light source device and a wavelength control device therefor. The light source device includes a plurality of laser diodes, a temperature sensor provided in the vicinity of the plurality of laser diodes, a control loop for controlling the temperatures of the plurality of laser diodes according to an output from the temperature sensor to thereby control the oscillation wavelengths of the plurality of laser diodes, and a unit for compensating temperature control conditions for the laser diodes other than a reference laser diode selected from the plurality of laser diodes, according to a change in temperature control condition for the reference laser diode. By the compensation of the temperature control conditions, the oscillation wavelength of each laser diode can be easily stabilized to each wavelength channel of WDM.

24 Claims, 8 Drawing Sheets

FIG. 5

| LD TEMP.(°C) | 26 | 30 | 34 | 38 | 42 | 46 | 50 |
|---|---|---|---|---|---|---|---|
| LD#1 | — | — | — | — | — | — | CH1 |
| LD#2 | CH2 | CH3 | CH4 | CH5 | CH6 | CH7 | CH8 |
| LD#3 | CH9 | CH10 | CH11 | CH12 | CH13 | CH14 | CH15 |
| LD#4 | CH16 | CH17 | CH18 | CH19 | CH20 | CH21 | CH22 |
| LD#5 | CH23 | CH24 | CH25 | CH26 | CH27 | CH28 | CH29 |
| LD#6 | CH30 | CH31 | CH32 | CH33 | CH34 | CH35 | CH36 |
| LD#7 | CH37 | CH38 | CH39 | CH40 | CH41 | CH42 | CH43 |
| LD#8 | CH44 | — | — | — | — | — | — |

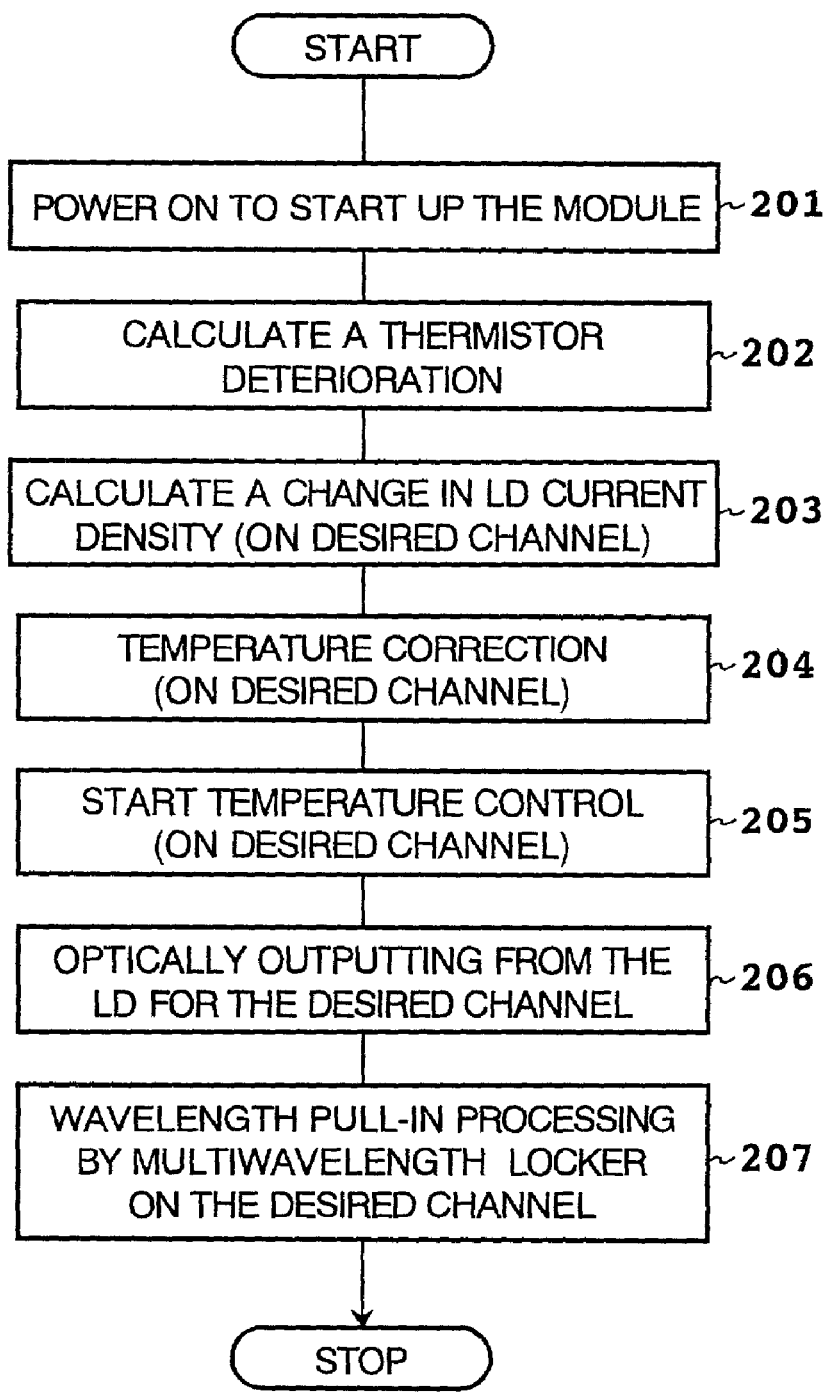

LIGHT SOURCE DEVICE AND WAVELENGTH CONTROL DEVICE THEREFOR

BACKGROUND OF THE INVENTION

1. Field of the Invention

The present invention relates to a light source device suitable for wavelength division multiplexing and a wavelength control device for the light source device.

2. Description of the Related Art

An optical communication system using an optical fiber transmission line is used to transmit a relatively large amount of information. A low-loss (e.g., 0.2 dB/km) optical fiber is manufactured and used as the optical fiber transmission line. In addition, an optical amplifier for compensating for losses in the optical fiber transmission line is used to allow long-haul transmission.

As a technique for increasing a transmission capacity by a single optical fiber, wavelength division multiplexing (WDM) is known. In a system adopting WDM, a plurality of carriers having different wavelengths are individually modulated by data. Each modulated carrier provides one channel in the WDM system for transmitting optical signals. These optical signals (i.e., the modulated carriers) are wavelength division multiplexed by an optical multiplexer to obtain WDM signal light. The WDM signal light is transmitted through an optical fiber tm line. At a receiving end, the WDM signal light received is separated into individual optical signals by an optical demultiplexer. Accordingly, data can be detected according to these individual optical signals. By applying WDM in this manner, the transmission capacity by a single optical fiber can be increased according to the number of WDM channels.

In recent years, it has been desired to construct not only a system in which one point and another point are connected by an optical fiber, but also a photonic network in which a plurality of points are connected by optical fiber transmission lines. According to WDM, the broadband and high-capacity performances of an optical fiber can be effectively used. Further by using a suitable optical filter, an optical signal having an arbitrary wavelength can be selected, dropped, or added regardless of modulation method and transmission speed. Accordingly, WDM is an effective technique in constructing a photonic network. In recent years, an IP (Internet Protocol) traffic has been rapidly increased, and the introduction of WDM transmission devices for supporting this traffic is successively carried out.

In WDM, a plurality of light sources for outputting light having different wavelengths (optical frequencies). At present, a wavelength spacing of 100 GHz is mainstream, and a system for wavelength division multiplexing of about 8 to 128 channels has been developed. The light sources used in this kind of system are usually DFB (distributed feedback) lasers, and they are provided as different kinds of fixed-wavelength light sources tailored according to oscillation wavelength. For example, in a 32-channel WDM system, 32 kinds of light sources (lasers) are present. In the case that the number of WDM channels is further increased in the future, the kind of spare light sources may increase in number, causing a serious problem.

To cope with this problem, it is effective to use a tunable laser capable of covering a plurality of wavelengths. That is, the single tunable laser can support a plurality of wavelengths, so that it is effective in decreasing the kind of spare light sources for WDM. Further, in an optical ADM (add/drop multiplexer) for dropping and adding an optical signal, a tunable laser may be used in adding an optical signal, thereby allowing the optical signal to be added with a wavelength corresponding to an arbitrary idle channel.

For example, there has been developed a tunable laser having eight integrated DFB lasers whose oscillation wavelengths are controlled according to temperature. This tunable laser has an advantage such that it can output optical signals having multiple wavelengths. However, there is a problem that a wavelength control device to be used in combination with this tunable laser becomes complicated in configuration.

SUMMARY OF THE INVENTION

It is therefore an object of the present invention to make wavelength control easy in a light source device applicable to WDM.

In accordance with a first aspect of the present invention, there is provided a light source device comprising a plurality of laser diodes; a temperature sensor provided in the vicinity of the plurality of laser diodes; a control loop for controlling the temperatures of the plurality of laser diodes according to an output from the temperature sensor to thereby control the oscillation wavelengths of the plurality of laser diodes; and means for compensating temperature control conditions for the laser diodes other than a reference laser diode selected from the plurality of laser diodes, according to a change in temperature control condition for the reference laser diode.

For example, the control loop may comprise an optical filter optically coupled to the plurality of laser diodes and having a transmittance substantially periodically changing with wavelength, and means for controlling the temperatures of the plurality of laser diodes so that the intensity of transmitted light through the optical filter becomes constant. In this case, by the compensation of the temperature control conditions, the oscillation wavelength of each laser diode can be easily stabilized to each wavelength channel of WDM with a wavelength control device having a simple configuration, thus achieving one of the objects of the present invention.

In accordance with a second aspect of the present invention, there is provided a wavelength control device for a light source device having a plurality of laser diodes, comprising a temperature sensor provided in the vicinity of the plurality of laser diodes; a control loop for controlling the temperatures of the plurality of laser diodes according to an output from the temperature sensor to thereby control the oscillation wavelengths of the plurality of laser diodes; and means for compensating temperature control conditions for the laser diodes other than a reference laser diode selected from the plurality of laser diodes, according to a change in temperature control condition for the reference laser diode.

In accordance with a third aspect of the present invention, there is provided a light source device comprising a plurality of laser diodes; a first temperature sensor provided in the vicinity of the plurality of laser diodes; a second temperature sensor provided at a position becoming lower in temperature than a position where the first temperature sensor is provided when driving the plurality of laser diodes; a control loop for controlling the temperatures of the plurality of laser diodes according to an output from the first temperature sensor to thereby control the oscillation wavelengths of the plurality of laser diodes; and means for compensating a detected temperature by the first temperature sensor according to a detected temperature by the second temperature sensor.

In accordance with a fourth aspect of the present invention, there is provided a wavelength control device for a light source device having a plurality of laser diodes, comprising a first temperature sensor provided in the vicinity of the plurality of laser diodes; a second temperature sensor provided at a position becoming lower in temperature than a position where the first temperature sensor is provided when driving the plurality of laser diodes; a control loop for controlling the temperatures of the plurality of laser diodes according to an output from the first temperature sensor to thereby control the oscillation wavelengths of the plurality of laser diodes; and means for compensating a detected temperature by the first temperature sensor according to a detected temperature by the second temperature sensor.

The above and other objects, features and advantages of the present invention and the manner of realizing them will become more apparent, and the invention itself will best be understood from a study of the following description and appended claims with reference to the attached drawings showing some preferred embodiments of the invention.

BRIEF DESCRIPTION OF THE DRAWINGS

FIG. 5 is a table showing another example of allocation of wavelength channels;

FIG. 8 is a flowchart showing another example of the control according to the present invention.

DETAILED DESCRIPTION OF THE PREFERRED EMBODIMENTS

Some preferred embodiments of the present invention will now be described in detail with reference to the attached drawings.

Figure 1:
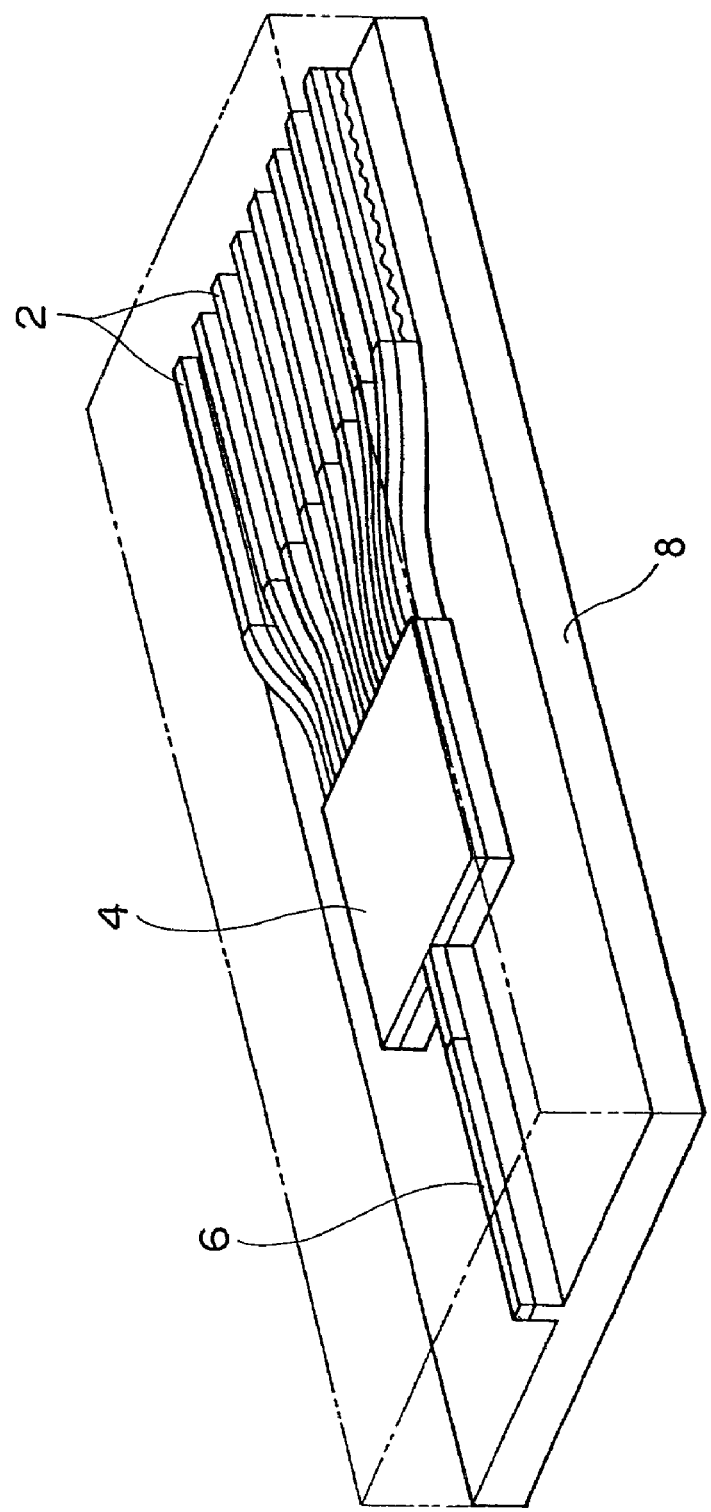
FIG. 1 is a perspective view showing a chip configuration of a tunable laser applicable to WDM.

FIG. 1 is a perspective view showing a chip configuration of a tunable laser applicable to WDM. This tunable laser is configured by integrating a plurality of (e.g., eight) arrayed DFB-LD (laser diode) elements 2, an optical coupler 4, and a semiconductor optical amplifier (SOA) 6 on a common substrate 8. An optical signal output from each DFB-LD element 2 is supplied through the optical coupler 4 to the semiconductor optical amplifier 6. The optical signal is then amplified by the amplifier 6 and output from this tunable laser.

The plural DFB-LD elements 2 are designed so that their center wavelengths differ from each other with a given spacing (e.g., 400 GHz (3.2 nm)) when the elements 2 are driven at the same temperature. Each DFB-LD element 2 has temperature dependence of oscillation wavelength of about 0.08 to 0.11 nm/° C. Accordingly, by giving a temperature change of about 8 to 10° C. to each DFB-LD element 2, its oscillation wavelength changes by 0.8 nm (100 GHz). In other words, a temperature change of 30° C. provides a change in oscillation wavelength corresponding to four grid channels (300 GHZ) recommended by ITU-T. Accordingly, if each DFB-LD element 2 can cover four channels, a wavelength band of 32 channels can be covered by the eight elements 2 (in the case that the wavelength spacing is 50 GHz, a wavelength band of 64 channels can be covered).

Figure 2:
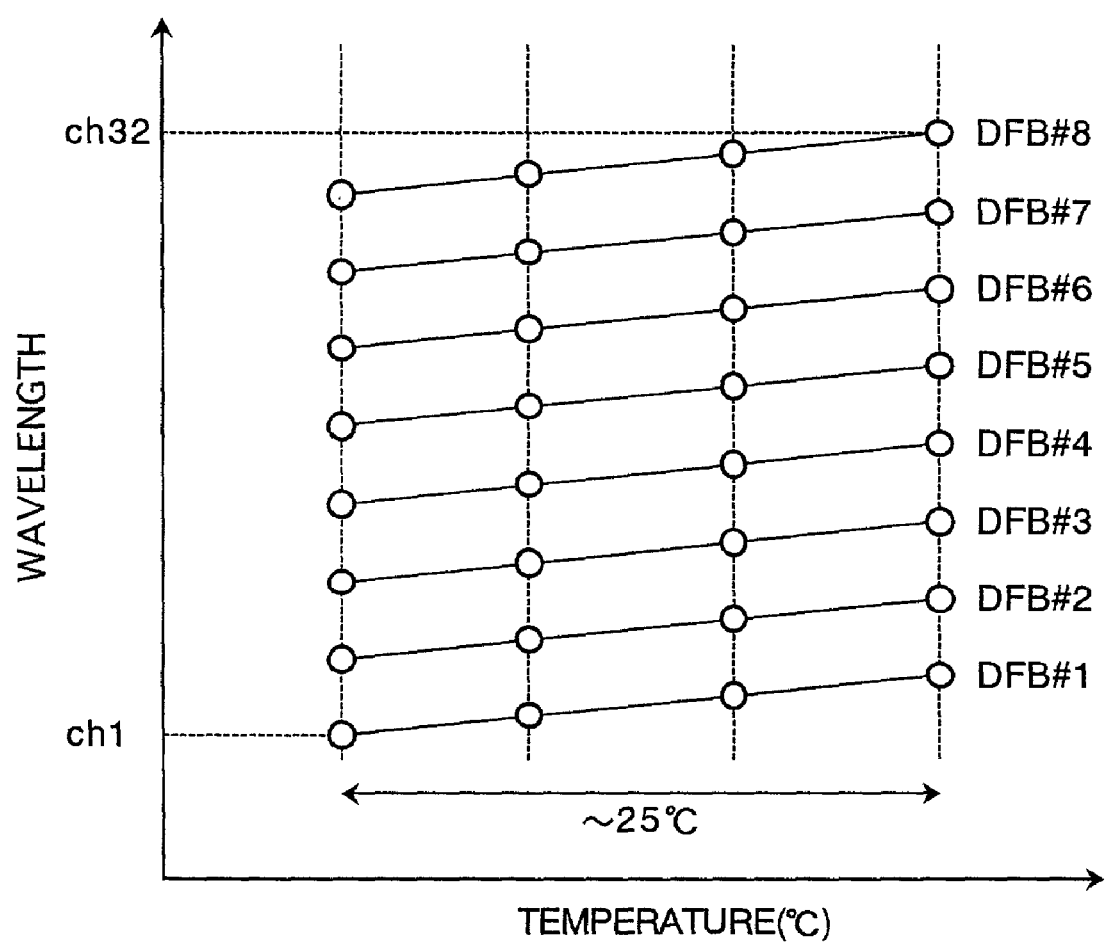
FIG. 2 is a graph showing an example of allocation of wavelength channels in the tunable laser shown in FIG. 1.

FIG. 2 is a graph showing an example of allocation of the wavelength channels in the tunable laser shown in FIG. 1. In FIG. 2, the vertical axis represents wavelength, and the horizontal axis represents temperature. In this example, the eight DFB-LD elements 2 (DFB #1 to DFB #8) equally share 32 channels sequentially from a shorter wavelength, i.e., each DFB-LD element 2 covers four channels.

Figure 3:
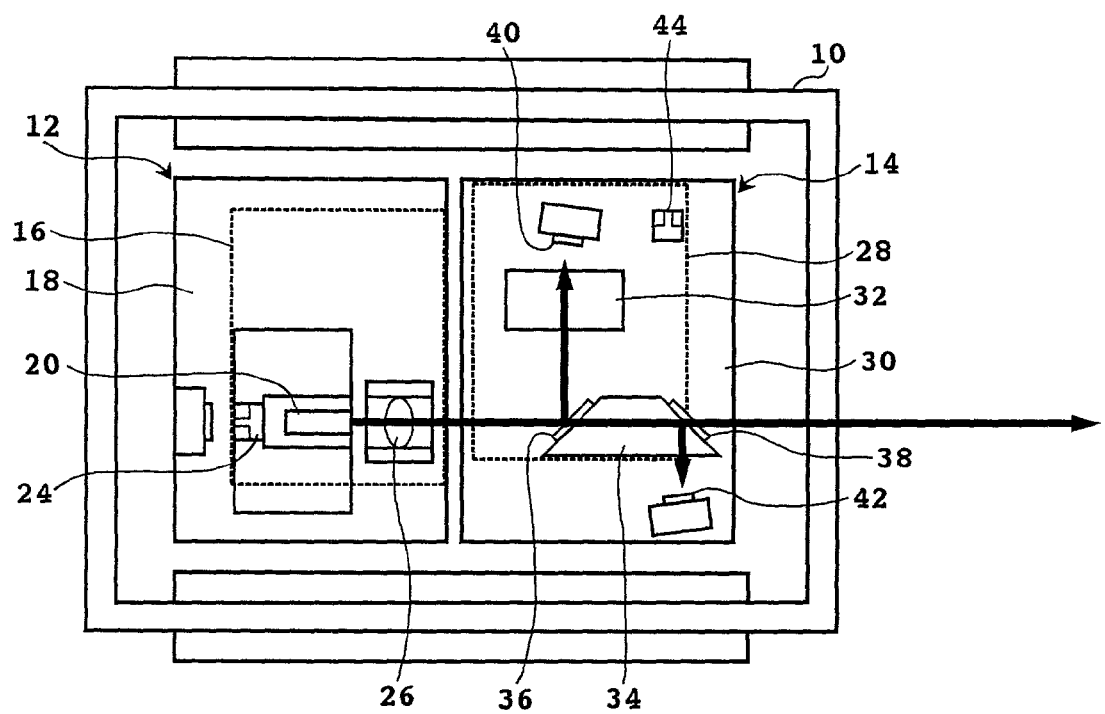
FIG. 3 is a view showing a preferred embodiment of a light source module as the light source device according to the present invention.

FIG. 3 is a view showing a preferred embodiment of a light source module as the light source device according to the present invention. This light source module has a light source unit 12 and a control unit (multiwavelength locker) 14 in a module housing 10.

The light source unit 12 includes a Peltier element 16 provided so as to allow heat exchange to the housing 10, an LD base 18 fixed to the Peltier element 16, an LD array chip 20 provided on the base 18, and a thermistor 24 as a temperature sensor provided in the vicinity of the LD array chip 20. As the LD array chip 20, the tunable laser shown in FIG. 1 may be used, for example. Light output from the LD array chip 20 is passed through a lens 26 and then output from this light source unit 12.

The control unit 14 includes a Peltier element 28 provided so as to allow heat exchange to the housing 10, an etalon base 30 fixed to the Peltier element 28, an etalon filter 32 provided on the base 30, and a glass block 34 provided on the base 30. The glass block 34 is in the form of a trapezoidal prism, and it is positioned so as to longitudinally transmit the light output from the light source unit 12. A pair of coupler films 36 and 38 are provided on the input and output slant surfaces of the glass block 34, respectively, so as to extract parts of the lights output from the light source unit 12. The light extracted by the coupler film 36 is supplied through the etalon filter 32 to a photodetector 40, in which the light is converted into an electrical signal according to the intensity of the light received. On the other hand, the light extracted by the coupler film 38 is supplied directly to a photodetector 42, in which the light is converted into an electrical signal according to the intensity of the light received.

The transmittance of the etalon filter 32 changes periodically according to the wavelength or frequency of incident light. Accordingly, wavelength control is allowed by changing the temperature of the LD array chip 20 so that the ratio in detection level between the photodetectors 40 and 42 becomes constant.

The etalon filter 32 used as a part of the multiwavelength locker has temperature dependence to be determined by its material. In the case of a general glass material, the etalon filter 32 has a temperature dependence of about 10 pm/° C. Accordingly, if the etalon filter 32 is mounted on the same base as that for mounting the LD array chip 20, the transmission peak of the etalon filter 32 varies with a change in temperature of the LD array chip 20. To cope with this problem, the etalon filter 32 is mounted on the etalon base 30 independent of the LD base 18 on which the LD array chip 20 is mounted as shown in FIG. 3.

The etalon filter 32 has an FSR (free spectral range) having a period twice the wavelength spacing of WDM, so that the pull-in range of the etalon filter 32 is as narrow as nearly twice the wavelength spacing. More specifically, in the case that the wavelength spacing is 100 GHz, the pull-in range is narrower than ±100 GHz (200 GHz as an allowable range). It is therefore important to control the initial starting wavelength of the LD array chip 20 within the pull-in range of the multiwavelength locker by temperature control using a monitor temperature in the thermistor 24 as a target temperature, before performing wavelength pull-in processing in the multiwavelength locker. In the case that the starting wavelength pulled in with the monitor temperature in the thermistor 24 used as a target temperature falls in its adjacent allowable wavelength pull-in range, there is a possibility that the starting wavelength may be erroneously pulled to the adjacent wavelength in the periodicity of the transmittance of the etalon filter 32 to wavelength. Such variations in the initial starting wavelength of the LD array chip 20 will be hereinafter referred to as wavelength drift.

The temperature of each LD is pulled to a target temperature based on the thermistor 24 until the starting wavelength enters the wavelength pull-in range of the multiwavelength locker. After the temperature of each LD is pulled to the target temperature, the power of each LD is controlled to a target power by using a monitor power detected by the photodetector 40 after transmission through the etalon filter 32. Accordingly, even when the temperature measured by the thermistor 24 changes from a temperature at the time of manufacturing this module because of wavelength drift, the starting wavelength can be pulled to a target wavelength.

For example, it is assumed that one of the LD elements 2 is driven to output light having a wavelength of 1550.0 nm and a power of +5 dBm and that the driving conditions after the pull-in operation of the multiwavelength locker are set to 100 mA and 25° C. at the time of manufacturing this module. Even when the driving conditions after the pull-in operation of the multiwavelength locker change to 120 mA and 28° C. after long-term use of this LD element, light having the same wavelength as the above is apparently output because the multiwavelength locker is used as a reference. However, in the case that this LD element is further deteriorated to cause an increase in wavelength drift, resulting in a situation that the driving conditions must be changed to 130 mA and 33° C. to output light having the wavelength of 1550.0 nm, there is a possibility that light having a wavelength of 1549.2 nm and a power of +3 dBm rather than 1550.0 nm and +5 dBm may be output at starting the operation because the driving conditions are controlled to the same conditions of 100 mA and 25° C. as those at the time of manufacturing this module. In this case, the multiwavelength locker tends to pull the starting wavelength to the adjacent lock point, so that the starting wavelength cannot be controlled to 1550.0 nm as desired.

The factors of the wavelength drift in the LD array chip 20 was examined, and the following results were found.

(1) With regard to the wavelength drift due to a change in LD current density, the amounts of drift to shorter wavelengths and longer wavelengths were −433 pm and 433 pm, respectively.

(2) With regard to the wavelength drift due to a deterioration of the thermistor, the amounts of drift to shorter wavelengths and longer wavelengths were −20 pm and 853 pm, respectively.

(3) With regard to the wavelength drift due to the influence of the temperature of the LD case (module housing 10), the amounts of drift to shorter wavelengths and longer wavelengths were −28 pm and 50 pm, respectively.

Accordingly, the total amounts of drift to shorter wavelengths and longer wavelengths due to the factors (1) to (3) were −481 pm and 1336 pm, respectively.

Thus, when all of the factors (1) to (3) are combined together, the starting wavelength changes from −0.5 nm to +1.3 nm at the maximum under the condition that the temperature is controlled to a constant value. In the case that the wavelength spacing is 0.8 nm (100 GHz), the allowable pull-in wavelength by the multiwavelength locker (etalon filter 32) ranges from −0.8 nm to +0.8 nm at the maximum, so that there is a possibility that the starting wavelength may be pulled to a longer-wavelength grid. In the case that the wavelength spacing is 0.4 nm (50 GHz), the allowable pull-in wavelength ranges from −0.4 nm to +0.4 nm at the maximum, so that there is a possibility that the starting wavelength may be pulled to adjacent grids.

(1) The wavelength drift due to a change in LD current density means that a current density in the LD changes with long-term use of the LD, causing a change in oscillation wavelength at the same temperature. This change is not rapid, but it is a gradual change with long-term use of the LD.

(2) In the wavelength drift due to a deterioration of the thermistor, the amount of drift to longer wavelengths is much greater than the amount of drift to shorter wavelengths. To cover multiple wavelengths by using the 8-element array, the set temperature of the chip must be changed between 15° C. and 50° C. by temperature control. In the case of long-term use of the chip at high temperatures, or in the case that the set temperature is changed with a period shorter than the thermal time constant of the thermistor, there occurs a problem that the thermistor itself may be deteriorated or an adhesive fixing the thermistor may be deteriorated, causing a deviation between an actual temperature and a monitor temperature detected by the thermistor. The deterioration of the thermistor is not rapidly occurs as in the factor (1).

(3) The wavelength drift due to the influence of the temperature of the LD case means that heat transfer is caused by a temperature difference between the LD and the LD case, causing a change in temperature of the LD chip. This drift is not related to aging, but occurs with a change in environment temperature or at the time of switching the wavelength.

Even if another temperature sensor is used to improve the wavelength drift due to the thermistor deterioration, the total amounts of drift due to the factors (1) and (3) only exceed the wavelength pull-in range (e.g., ±0.4 nm) of the etalon. It is therefore desired to compensate for this wavelength drift.

Figure 4:
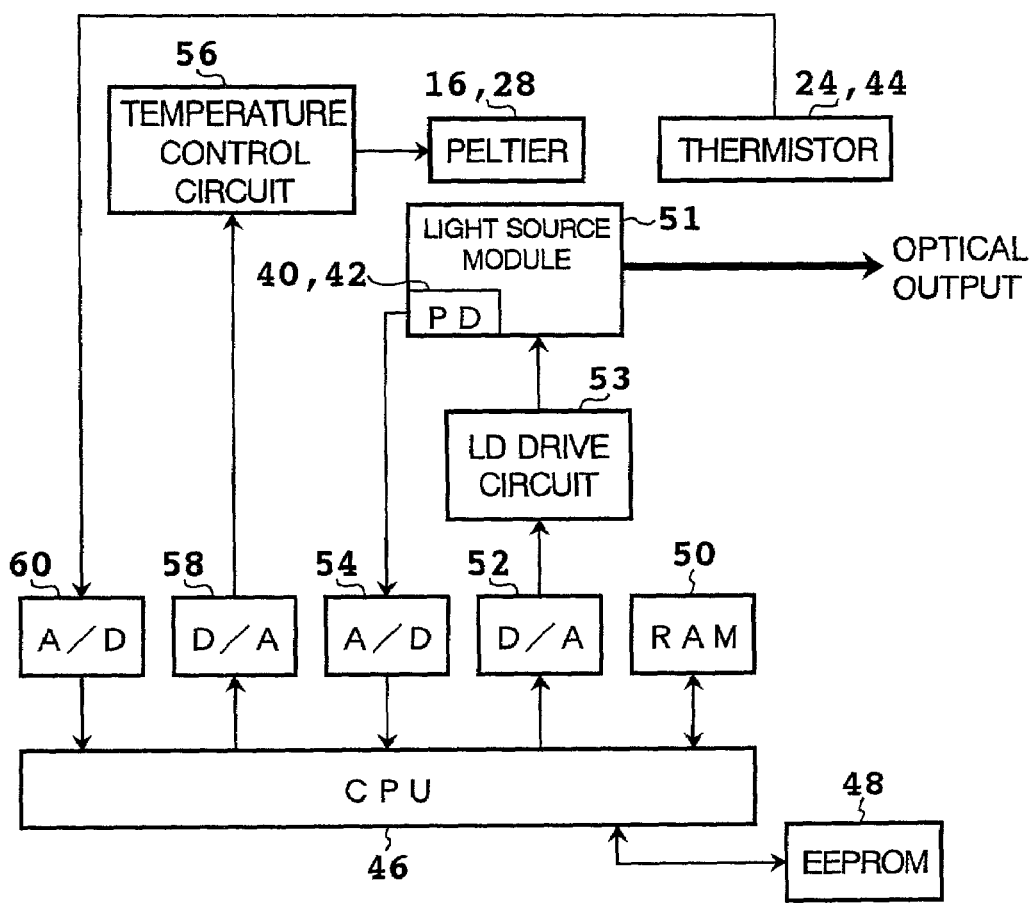
FIG. 4 is a block diagram showing a preferred embodiment of the wavelength control device according to the present invention.

FIG. 4 is a block diagram of the light source device (including the wavelength control device) according to the present invention. A CPU 46 is provided to perform various computations related to control and driving. The CPU 46 is connected through a bidirectional bus to an EEPROM 48 in which data and programs for the computations are preliminarily stored. The CPU 46 is further connected through a bidirectional bus to a RAM 50 for temporarily storing the results of the computations. An LD drive circuit 53 is provided to drive the LD array chip 20 (see FIG. 3) in a light source module 51. Data related to a drive current or the like is supplied from the CPU 46 through a D/A converter 52 to the drive circuit 53. Outputs from the photodetectors 40 and 42 in the light source module 51 are supplied through an A/D converter 54 to the CPU 46. A temperature control circuit 56 is connected to the Peltier elements 16 and 28, so as to control the temperatures of the LD array chip 20 and the etalon filter 32 (see FIG. 3). A control signal is supplied from the CPU 46 through a D/A converter 58 to the control circuit 56. Outputs from the thermistors 24 and 44 for temperature measurement related to the temperature control are supplied through an A/D converter 60 to the CPU 46.

In the case that the LD array chip 20 is composed of eight arrayed LDs (elements), the oscillation wavelength of each LD changes by about 0.8 nm with a temperature change of 10° C. Accordingly, by designing the center wavelengths of the eight LDs with a wavelength spacing of 3.2 nm as shown in FIG. 2, four wavelengths can be covered by a temperature change of 30° C. In the case of eight LDS, continuous 32 wavelengths (wavelength spacing of 0.8 nm) can be covered.

Preferably, one of the eight LDs is set as a reference and it is normally inoperative. In this case, each of the remaining seven LDs covers four channels, so that a tunable laser capable of output light having 28 wavelengths is obtained. More generally, in the case that m LDs are arranged and each LD covers n wavelengths to obtain a tunable laser capable of outputting light having (m×n) wavelengths, (m+1) LDs are preliminarily arranged and one of the (m+1) LDs is set as a reference which is normally inoperative.

Alternatively, in the case of using all the LDS to increase the number of channels as shown in FIG. 5, one of the LDs that is normally inoperative only at a lower temperature is set as a reference. FIG. 5 is a table showing another example of allocation of the wavelength channels. In this example, the LD #8 covering the 44-th channel (CH 44) is set as a reference. Although the reference LD (the LD #8 in this case) may be normally operated, it is preferable to operate the reference LD at temperatures lower than or equal to ordinary temperature, so as to reduce a deterioration (current density or its change) of the LD.

The reference LD is normally inoperative, so that the LD deterioration is small and a change in LD current density is therefore nearly zero. Accordingly, in the case that a set temperature (Tref1) of the reference LD after wavelength stabilization by the wavelength locker at the time of manufacturing the LD is different from a set temperature (Tref2) of the reference LD after wavelength stabilization by the wavelength locker after the elapse of a long period of time (e.g., about 10 years), the difference (Tref1−Tref2) is considered to be due to the deterioration of the thermistor. That is, by using a reference LD in which a change in LD current density is small, comparing an initial set temperature and a latest set temperature of the reference LD, and considering the difference between these set temperatures to be due to the thermistor deterioration, the amount of deterioration of the thermistor (the difference between the initial set temperature and the latest set temperature) can be grasped.

The influence of the temperature of the LD case as described above as the factor (3) is much smaller than the factors (1) and (2), and is negligible in a condition where the control time is sufficient such as in the initial pull-in operation. Accordingly, the amount of wavelength drift of the LD may be artificially considered as follows:

(the amount of wavelength drift of the LD)=(the amount of change in LD current density as the factor (1))+(the amount of deterioration of the thermistor as the factor (2)).

Accordingly, by grasping the amount of wavelength drift of each LD and the amount of deterioration of the thermistor, the amount of change in current density of each LD can be calculated and compensated. The amount of wavelength drift of each LD can be calculated by comparing the set temperature Tref1 adjusted at the time of manufacturing the LD and a latest set temperature Tref3 after the elapse of a given time period. More specifically, the amount of wavelength drive can be calculated by the following equation.

(temperature change corresponding to the wavelength drift)=Tref1−Tref3

Further, since the single thermistor 24 is provided to detect the temperature of the LD array chip 20 in this preferred embodiment, the wavelength drift due to the thermistor deterioration as the factor (2) is common to the eight LDs of the LD array chip 20. However, the change in LD current density as the factor (1) differs according to the use frequencies of the eight LDs.

Accordingly, even when the amount of wavelength drift calculated on any one of the LDs is used to compensate for the wavelength drift of the other LDS, it is difficult to perform proper compensation for the wavelength drift of the other LDS.

Accordingly, the amounts of wavelength drift of all the LDs must be individually calculated. By storing the amounts of wavelength drift, λn of the eight LDs and updating the latest set temperature Tref at given time intervals for any one of the LDs during optical outputting, the temperature change corresponding to the wavelength drift of each LD can be always grasped, thereby allowing the individual compensation for the wavelength drift of all the LDS.

Figure 6:
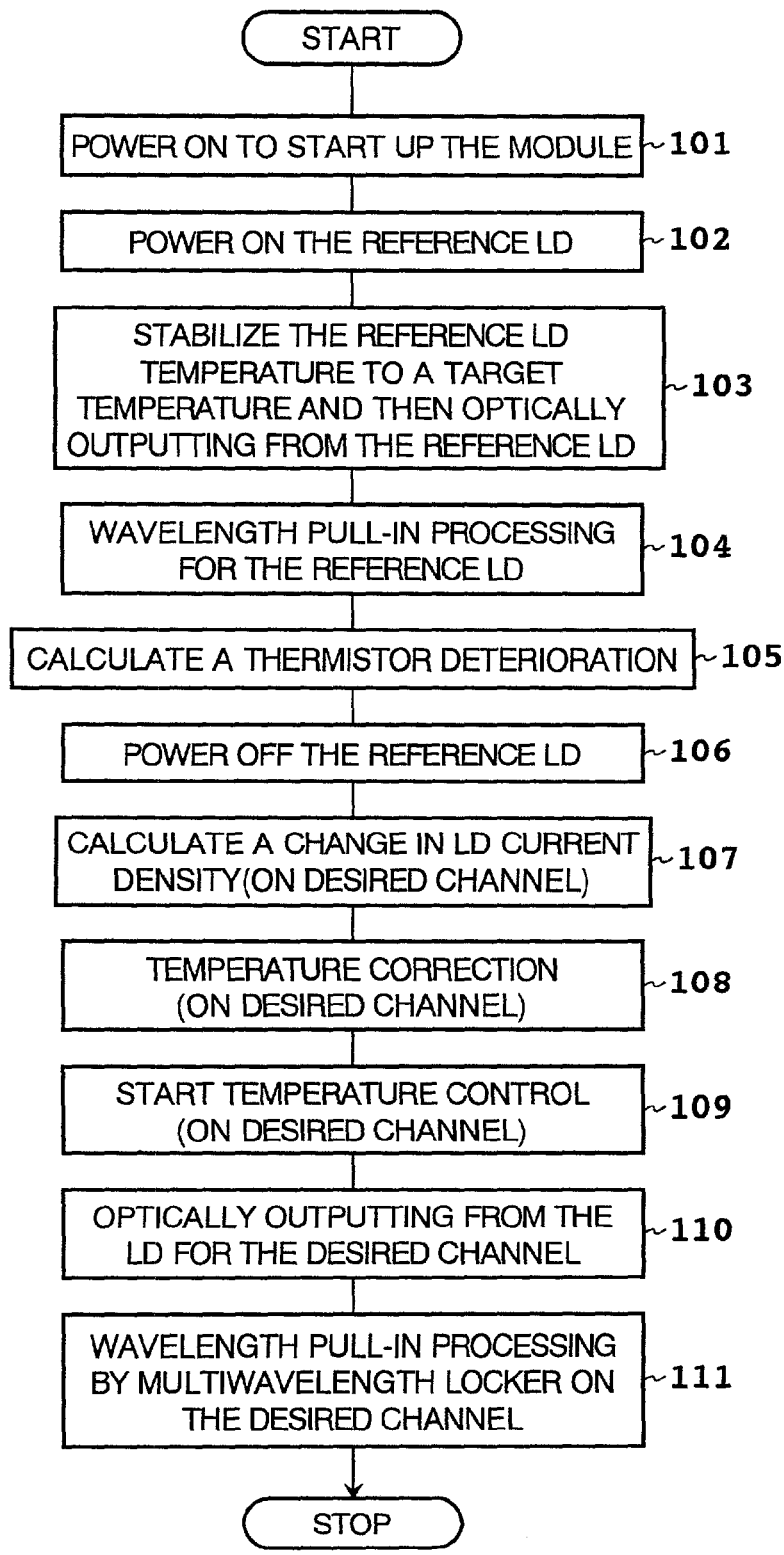
FIG. 6 is a flowchart showing an example of the control according to the present invention.

Referring to FIG. 6, there is shown a flowchart of start-up processing with the wavelength drift being corrected in the device shown in FIG. 4. In step 101, the device is powered on and the start-up processing is started. In step 102, a reference LD is started up by using a set value stored in the EEPROM 48. In step 103, the temperature control ct 56 is operated so that the temperature of the reference LD is stabilized to a target temperature determined by the set value, and optical outputting from the reference LD is started.

In step 104, wavelength pull-in processing using the multiwavelength locker, or feedback control is performed on the reference LD.

In step 105, a thermistor deterioration (a deterioration of the thermistor 24) is calculated. More specifically, a latest set temperature and an initial set temperature after the wavelength pull-in processing are compared to calculate a temperature difference corresponding to the thermistor deterioration. That is, the computation expressed by the following equation is executed.

(temperature difference corresponding to the thermistor deterioration)=(initial set temperature)−(latest set temperature).

In step 106, the reference LD is turned off, and set data for a desired channel is read from the EEPROM 48.

In step 107, a change in LD current density on the desired channel is calculated. More specifically, a latest set temperature of the LD for outputting light having a wavelength of the desired channel is read, and a temperature difference between the latest set temperature and the initial set temperature is calculated. Then, a change in LD current density on the desired channel is calculated from the above temperature difference and the temperature difference corresponding to the thermistor deterioration calculated in step 105. That is, the computation expressed by the following equation is executed.

(change in LD current density)=[(initial set temperature on desired channel)−(latest set temperature on desired channel)]−(temperature difference corresponding to the thermistor deterioration).

In step 108, temperature correction on the desired channel is executed. More specifically, a starting temperature of the LD for the desired channel is corrected in accordance with the following equation.

(LD starting temperature)=(initial set temperature of the LD)+(thermistor deterioration)+(change in LD current density)

In step 109, temperature control on the desired channel is started.

In step 110, optical outputting from the LD for the desired channel is started after the result of the temperature control in step 109 is stabilized.

In step 111, wavelength pull-in processing on the desired channel is performed by the multiwavelength locker, and this start-up processing is ended.

After ending this start-up processing, wavelength control is performed by the multiwavelength locker, and simultaneously a set temperature of the LD during optical outputting is stored at given time intervals, thereby facilitating the updating of the above-mentioned temperature correction.

While the LD array chip 20 in this preferred embodiment has eight LDs, the number of LDs is not limited. For example, in the case that the LD array chip 20 has four LDS, one of the four LDs is set as a reference and the remaining three LDs are normally used. More generally, in the case of using an LD array chip having N LDs, k ($1 \leq k < N$) LDs are set as a reference and the remaining LDs are normally used.

As the reference LD, the LD located at an end of the array is preferably used. Although it is advantageous to use the LD located at or near the center of the array as the reference LD from the viewpoint that the average among all the LDs can be taken. However, if the LD located at or near the center of the array is used as the reference LD, there is a possibility that the control of the center wavelength of each LD in manufacturing the LD array chip may become difficult. This is due to the fact that the wavelength control in manufacturing the LD array chip becomes easy when the LDs except the reference LD located in consecutive positions are simultaneously formed.

Figure 7:
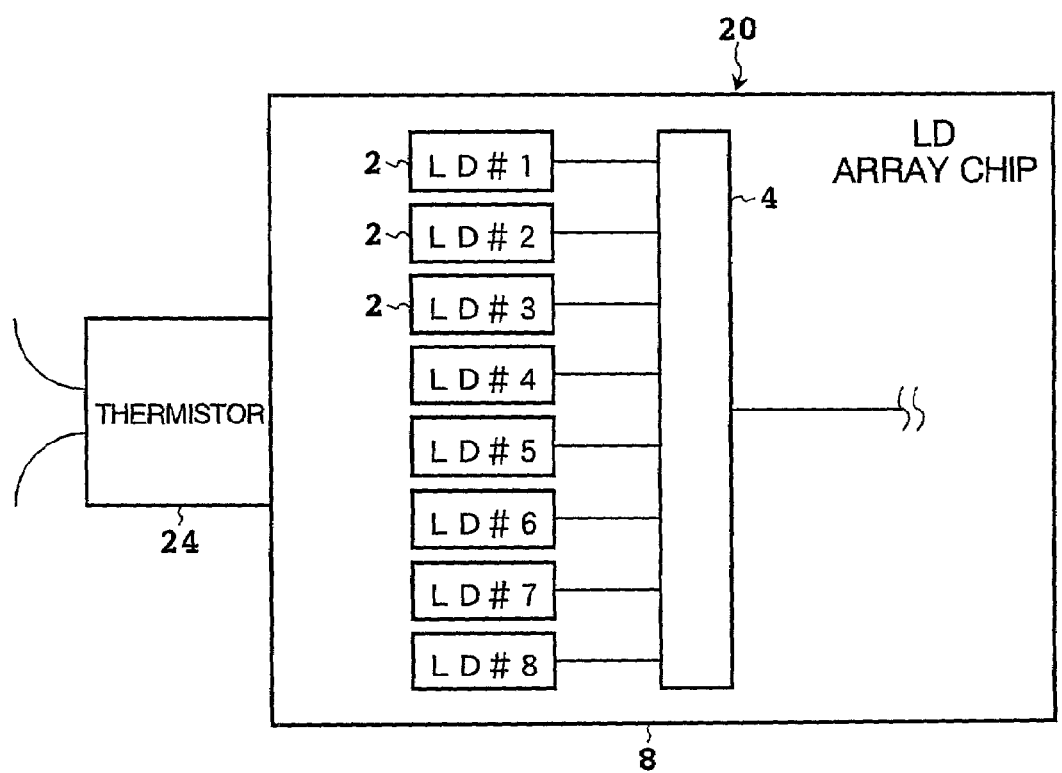
FIG. 7 is a view for illustrating the location of a thermistor in an LD array chip.

On the other hand, the thermistor 24 for detecting the temperature of the LD array chip 20 is preferably located in the vicinity of the center of the array of all the LDs as shown in FIG. 7, so as to simultaneously monitor the temperatures of all the LDS. In FIG. 7, LD #1 to LD #8 correspond to the DFB-LD elements 2 shown in FIG. 1.

A temperature change corresponding to the amount of wavelength drift of each LD can be calculated by comparing a latest set temperature and an initial set temperature. Further, a change in current density of each LD can be calculated by grasping the amount of thermistor deterioration.

In the light source module shown in FIG. 3, the thermistor 24 is used to detect the temperature of the LD array chip 20, and the thermistor 44 is used to detect the temperature of the etalon filter 32. Since the thermistor 24 is mounted on the LD base 18, the temperature of the thermistor 24 changes with changes in output wavelength channel. Accordingly, the temperature of the thermistor 24 may remain near 50° C. at the maximum, so that the deterioration of the thermistor 24 is large. On the other hand, the thermistor 44 is used to control the temperature of the etalon filter 32 to a constant temperature within the range of 25 to 30° C., so that a temperature change of the thermistor 44 is relatively small and its deterioration is therefore small.

In this manner, the temperatures of the thermistors 24 and 44 change independently during the operation of the light source module. However, before the light source module is powered on, the temperature distribution in the module is relatively gentle, so that it is considered that substantially the same temperature is monitored at the positions of the thermistors 24 and 44. Accordingly, by monitoring the temperatures of the thermistors 24 and 44 immediately after powering on the light source module and before starting the temperature control, and then regarding the difference of these monitored temperatures as being due to the deterioration of the thermistor 24, the amount of deterioration of the thermistor 24 can be grasped.

It is assumed that the temperatures of the thermistors 24 and 44 at the time of manufacturing the light source module at some environmental temperature are T1 and T 2, respectively. Further, it is assumed that after long-term use of this light source module, the temperatures of the thermistors 24 and 44 immediately after powering on the module and before starting the temperature control are T3 and T4, respectively. In this case, the initial temperature difference $\Delta Tf$ between the thermistors 24 and 44 is (T1–T2), and the temperature difference $\Delta Tl$ between the thermistors 24 and 44 after the elapse of a long time period is (T3–T4).

The deterioration of the thermistor 44 is negligible, and the difference of the initial temperature difference $\Delta Tf$ and the temperature difference $\Delta Tl$ is expressed as follows:

$$\Delta Tf - \Delta Tl = (T1 - T2) - (T3 - T4)$$
$$= (T1 - T3) - (T2 - T4)$$

If the environmental temperature is unchanged, and T2=T4, the above difference becomes as follows:

$$\Delta Tf - \Delta Tl = (T1 - T3)$$

This value (T1–T3) represents a difference in temperature of the thermistor 24 between at the initial stage and after the elapse of a long time period, i.e., the amount of deterioration of the thermistor 24. Also in the case of T2$\neq$T4, the updated amount of deterioration of the thermistor 24 can be always grasped by storing the temperature difference $\Delta Tf$=T1–T2 at the time of manufacturing in the EEPROM 48 and measuring the temperature difference $\Delta Tl$=T3–T4 every time the module is started. This will now be described more specifically.

FIG. 8 is a flowchart for illustrating another example of the start-up processing with the wavelength drift being corrected. In step 201, the light source module is powered on to start the start-up processing.

In step 202, the temperatures of the thermistors 24 and 44 are monitored, and this temperature difference $\Delta Tl$ is compared with the initial temperature difference $\Delta Tf$ between the thermistors 24 and 44 at the time of manufacturing to calculate the amount of deterioration of the thermistor 24 corresponding to the temperature difference ($\Delta Tf - \Delta Tl$). The initial temperature difference $\Delta Tf$ (=T1–T2) is read from the EEPROM 48.

In step 203, the latest set temperature of the LD for outputting light of a desired wavelength channel is read, and the difference between the latest set temperature and the initial set temperature is calculated. Then, a change in current density of the LD for outputting light of the desired wavelength channel is calculated in accordance with the following equation by using the above difference in set temperature of the LD and the amount of thermistor deterioration calculated in step 202.

(change in LD current density)=[(initial set temperature on desired channel)–(latest set temperature on desired channel)]–(temperature difference corresponding to the thermistor deterioration)

In step 204, temperature correction on the desired channel is executed. More specifically, a starting temperature of the LD for the desired channel is corrected in accordance with the following equation.

(LD starting temperature)=(initial set temperature of the LD)+(thermistor deterioration)+(change in LD current density)

In step 205, temperature control on the desired channel is started. In step 206, optical outputting from the LD for the desired channel is started after the result of the temperature control in step 205 is stabilized. In step 207, wavelength pull-in processing on the desired channel is performed by the multiwavelength locker, and this start-up processing is ended.

After ending this start-up processing, wavelength control is performed by the multiwavelength locker, and simultaneously a set temperature of the LD during optical outputting is stored at given time intervals, thereby facilitating the updating of the above-mentioned temperature correction.

While the thermistors 24 and 44 are provided on the same module housing 10 in this preferred embodiment, the thermistors 24 and 44 may be provided in different housings by providing the LD base 18 and the etalon base 30 in the different housings.

While the thermistor 44 is provided for the wavelength locker in this preferred embodiment, the thermistor 44 may be replaced by any thermistor to be used under the conditions that its temperature does not become high and a large temperature change is not associated.

Further, three or more thermistors may be used to similarly carry out the present invention. In this case, at least one of the thermistors is preferably located at a position where its temperature does not become high and a large temperature change is not associated.

Further, the whole of the LD module may be mounted on a temperature control device (e.g., Peltier cooler), so as to maintain the temperature of the LD module at starting always constant (T2=T4), thereby generally controlling the temperature of the LD module.

According to the present invention as described above, it is possible to make wavelength control easy in a light source device applicable to WDM. The effects exhibited by the specific preferred embodiments of the present invention have been described above, so the description thereof will be omitted herein.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A light source device comprising:
   a plurality of laser diodes comprising a reference laser diode;
   a temperature sensor provided in the vicinity of said plurality of laser diodes;
   a control loop for controlling the temperatures of said plurality of laser diodes according to an output from said temperature sensor and temperature control conditions for said laser diodes to control oscillation wavelengths of said plurality of laser diodes;
   means for compensating the temperature control conditions for said laser diodes other than the reference laser diode, according to a change in a temperature control condition for said reference laser diode; and
   an optical filter in said control loop coupled to said plurality of laser diodes and having a transmittance substantially periodically changing with the wavelength of an incident light,
   wherein
   the reference laser diode is operated at temperatures lower than or equal to an ordinary temperature, and
   said change in said temperature control condition for said reference laser diode comprises a result of a comparison between an initial set temperature and a latest set temperature, where
   a deterioration of said temperature sensor reflects the compensation of said temperature control conditions of said laser diodes other than said reference laser diode, and
   an initial starting wavelength of an optical signal outputted from said laser diodes other than said reference laser diode is controlled within a desired wavelength pull-in range.

2. A light source device according to claim 1, wherein the oscillation wavelengths of said plurality of laser diodes are different from each other, and said plurality of laser diodes are selectively driven.

3. A light source device according to claim 1, wherein said temperature sensor comprises a thermistor.

4. A light source device according to claim 1, wherein said change in said temperature control condition for said reference laser diode comprises a result of comparison between an initial set temperature and a latest set temperature, whereby a deterioration of said temperature sensor reflects the compensation of said temperature control conditions of said laser diodes other than said reference laser diode.

5. A light source device according to claim 4, wherein said reference laser diode is driven so as to become lower in temperature than said laser diodes other than said reference laser diode.

6. A light source device according to claim 1, wherein said plurality of laser diodes are arranged in an array, and said reference laser diode is positioned at an end of said array.

7. A light source device according to claim 1, wherein said plurality of laser diodes are arranged in an array, and said temperature sensor is positioned near the center of said array.

8. A light source device according to claim 1, wherein said control loop further comprises means for controlling the temperatures of said plurality of laser diodes so that the intensity of transmitted light through said optical filter becomes constant.

9. A wavelength control device for a light source device having a plurality of laser diodes including a reference laser diode, comprising:
   a temperature sensor provided in the vicinity of said plurality of laser diodes;
   a control loop for controlling the temperatures of said plurality of laser diodes according to an output from said temperature sensor and temperature control conditions for said laser diodes to control oscillation wavelengths of said plurality of laser diodes;
   means for compensating the temperature control conditions for said laser diodes other than the reference laser diode, according to a change in a temperature control condition for said reference laser diode; and
   an optical filter in said control loop coupled to said plurality of laser diodes and having a transmittance substantially periodically changing with the wavelength of an incident light,
   wherein
   the reference laser diode is operated at temperatures lower than or equal to an ordinary temperature, and said change in said temperature control condition for said reference laser diode comprises a result of a comparison between an initial set temperature and a latest set temperature, where
   a deterioration of said temperature sensor reflects the compensation of said temperature control conditions of said laser diodes other than said reference laser diode, and
   an initial starting wavelength of an optical signal outputted from said laser diodes other than said reference laser diode is controlled within a desired wavelength pull-in range.

10. A wavelength control device according to claim 9, wherein said temperature sensor comprises a thermistor.

11. A wavelength control device according to claim 9, wherein said change in said temperature control condition for said reference laser diode comprises a result of comparison between an initial set temperature and a latest set temperature, whereby a deterioration of said temperature sensor reflects the compensation of said temperature control conditions of said laser diodes other than said reference laser diode.

12. A wavelength control device according to claim 9, wherein said control loop further comprises means for controlling the temperatures of said plurality of laser diodes so that the intensity of transmitted light through said optical filter becomes constant.

13. A light source device comprising:
   a plurality of laser diodes comprising a reference laser diode;
   a first temperature sensor provided in the vicinity of said plurality of laser diodes;
   a second temperature sensor provided at a position becoming lower in temperature than a position where said first temperature sensor is provided when driving said plurality of laser diodes;
   a control loop for controlling the temperatures of said plurality of laser diodes according to an output from said first temperature sensor and a control signal to control oscillation wavelengths of said plurality of laser diodes;
   means for compensating a detected temperature by said first temperature sensor according to a detected temperature by said second temperature sensor and according to a change in respective temperature control conditions for the reference laser diode and outputting the control signal based on the detected temperatures and the temperature control conditions; and
   an optical filter in said control loop coupled to said plurality of laser diodes and having a transmittance substantially periodically changing with the wavelength of an incident light,
   wherein
   the reference laser diode is operated at temperatures lower than or equal to an ordinary temperature, and
   said change in said temperature control condition for said reference laser diode comprises a result of a comparison between an initial set temperature and a latest set temperature, where
     a deterioration of said temperature sensor reflects the compensation of said temperature control conditions of said laser diodes other than said reference laser diode, and
     an initial starting wavelength of an optical signal outputted from said laser diodes other than said reference laser diode is controlled within a desired wavelength pull-in range.

14. A light source device according to claim 13, wherein the oscillation wavelengths of said plurality of laser diodes are different from each other, and said plurality of laser diodes are selectively driven.

15. A light source device according to claim 13, wherein each of said first and second temperature sensors comprises a thermistor.

16. A light source device according to claim 13, wherein said control loop further comprises means for controlling the temperatures of said plurality of laser diodes so that the intensity of transmitted light through said optical filter becomes constant.

17. A light source device according to claim 16, wherein:
   said second temperature sensor is provided in the vicinity of said optical filter;
   said light source device further comprising means for controlling the temperature of said optical filter according to an output from said second temperature sensor so that the temperature of said optical filter is maintained constant.

18. A wavelength control device for a light source device having a plurality of laser diodes including a reference laser diode, comprising:
   a first temperature sensor provided in the vicinity of said plurality of laser diodes;
   a second temperature sensor provided at a position becoming lower in temperature than a position where said first temperature sensor is provided when driving said plurality of laser diodes
   a control loop for controlling the temperatures of said plurality of laser diodes according to an output from said first temperature sensor and a control signal to thereby control the oscillation wavelengths of said plurality of laser diodes; and
   means for compensating g a detected temperature by said first temperature sensor according to a detected temperature by said second temperature sensor and according to a change in temperature control condition for the reference laser diode and outputting the control signal based on the detected temperatures and the temperature control condition; and
   an optical filter in said control loop coupled to said plurality of laser diodes and having a transmittance substantially periodically changing with the wavelength of incident light,
   wherein
   the reference laser diode is operated at temperatures lower than or equal to an ordinary temperature, and
   said change in said temperature control condition for said reference laser diode comprises a result of a comparison between an initial set temperature and a latest set temperature, where
     a deterioration of said temperature sensor reflects the compensation of said temperature control conditions of said laser diodes other than said reference laser diode, and
     an initial starting wavelength of an optical signal outputted from said laser diodes other than said reference laser diode is controlled within a desired wavelength pull-in range.

19. A wavelength control device according to claim 18, wherein each of said first and second temperature sensors comprises a thermistor.

20. A wavelength control device according to claim 18, wherein said control loop further comprises means for controlling the temperatures of said plurality of laser diodes so that the intensity of transmitted light through said optical filter becomes constant.

21. A light source device comprising:
a plurality of laser diodes comprising a reference laser diode;
a temperature sensor provided in a vicinity of said plurality of laser diodes;
a control loop controlling temperatures of said plurality of laser diodes according to an output from said temperature sensor and temperature control conditions for said laser diodes to thereby control oscillation wavelengths of said plurality of laser diodes;
a compensator compensating the temperature control conditions for said laser diodes other than the reference laser diode, according to a change in a temperature control condition for said reference laser diode; and
an optical filter in said control loop coupled to said plurality of laser diodes and having a transmittance periodically changing with a wavelength of light incident thereon,
wherein the reference laser diode is operated at temperatures lower than or equal to an ordinary temperature, said change in said temperature control condition for said reference laser diode comprises a result of comparison between an initial set temperature and a latest set temperature, a deterioration of said temperature sensor reflects the compensation of the temperature control conditions for said laser diodes other than said reference laser diode and an initial starting wavelength of an optical signal output from said laser diodes other than said reference laser diode is controlled within a desired wavelength pull-in range.

22. A wavelength control device for a light source device having a plurality of laser diodes including a reference laser diode, comprising:
a temperature sensor provided in a vicinity of said plurality of laser diodes;
a control loop controlling temperatures of said plurality of laser diodes according to an output from said temperature sensor and temperature control conditions for said laser diodes to thereby control oscillation wavelengths of said plurality of laser diodes;
a compensator compensating the temperature control conditions for said laser diodes other than the reference laser diode, according to a change in a temperature control condition for the reference laser diode; and
an optical filter in said control loop coupled to said plurality of laser diodes and having a transmittance periodically changing with a wavelength of a light incident thereon,
wherein the reference laser diode is operated at temperatures lower than or equal to an ordinary temperature, said change in said temperature control condition for said reference laser diode comprises a result of comparison between an initial set temperature and a latest set temperature, a deterioration of said temperature sensor reflects the compensation of the temperature control conditions for said laser diodes other than said reference laser diode and an initial starting wavelength of an optical signal output from said laser diodes other than said reference laser diode is controlled within a desired wavelength pull-in range.

23. A light source device comprising:
a plurality of laser diodes comprising a reference laser diode;
a first temperature sensor provided at a first position in a vicinity of said plurality of laser diodes;
a second temperature sensor provided at a second position becoming lower in temperature than the first position when driving said plurality of laser diodes;
a control loop controlling temperatures of said plurality of laser diodes according to an output from said first temperature sensor and a control signal to thereby control oscillation wavelengths of said plurality of laser diodes;
a compensator compensating a temperature detected by said first temperature sensor according to a temperature detected by said second temperature sensor and according to a change in a temperature control condition for the reference laser diode and outputting the control signal based on the detected temperatures and the temperature control condition; and
an optical filter in said control loop coupled to said plurality of laser diodes and having a transmittance periodically changing with a wavelength of light incident thereon,
wherein the reference laser diode is operated at a temperature lower than or equal to an ordinary temperature, said change in said temperature control condition for said reference laser diode comprises a result of comparison between an initial set temperature and a latest set temperature, a deterioration of at least one of said temperature sensors reflects a compensation of said temperature control condition for said laser diodes other than the reference laser diode and an initial starting wavelength of an optical signal output from said laser diodes other than said reference laser diode is controlled within a desired wavelength pull-in range.

24. A wavelength control device for a light source device having a plurality of laser diodes including a reference laser diode, comprising:
a first temperature sensor provided in a first position in a vicinity of said plurality of laser diodes;
a second temperature sensor provided at a second position becoming lower in the first position when driving said plurality of laser diodes;
a control loop controlling temperatures of said plurality of laser diodes according to an output from said first temperature sensor and a control signal to thereby control oscillation wavelengths of said plurality of laser diodes;
a compensator compensating a temperature detected by said first temperature sensor according to a temperature detected by said second temperature sensor and according to a change in a temperature control condition for the reference laser diode and outputting the control signal based on the detected temperatures and the temperature control condition; and
an optical filter in said control loop coupled to said plurality of laser diodes and having a transmittance periodically changing with a wavelength of a light incident thereon,
wherein the reference laser diode is operated at a temperature lower than or equal to an ordinary temperature, said change in said temperature control condition for said reference laser diode comprises a result of comparison between an initial set temperature and a latest set temperature, a deterioration of said first temperature sensor reflects a compensation of the temperature control condition of said laser diodes other than said reference laser diode and an initial starting wavelength of an optical signal output from said laser diodes other than said reference laser diode is controlled within a desired wavelength pull-in range.

* * * * *

UNITED STATES PATENT AND TRADEMARK OFFICE
CERTIFICATE OF CORRECTION

PATENT NO. : 6,996,142 B2
APPLICATION NO. : 09/804250
DATED : February 7, 2006
INVENTOR(S) : Yutaka Kai et al.

It is certified that error appears in the above-identified patent and that said Letters Patent is hereby corrected as shown below:

Column 14, line 29, Claim 18, replace "diodes" with --diodes;--, therefor;

Column 14, line 35, Claim 18, after "compensating" delete the letter "g".

Signed and Sealed this

Eleventh Day of July, 2006

JON W. DUDAS
*Director of the United States Patent and Trademark Office*